United States Patent
Tang et al.

(10) Patent No.: US 11,306,220 B2
(45) Date of Patent: Apr. 19, 2022

(54) FLEXIBLE ENCAPSULATING MATERIAL, PROCESS FOR PREPARING THE SAME AND ENCAPSULATING METHOD USING THE SAME

(71) Applicant: eChem Solutions Corp., Taoyuan (TW)

(72) Inventors: Zong-Hao Tang, Taoyuan (TW); Hsin-Jen Chen, Hsinchu County (TW)

(73) Assignee: eChem Solutions Corp., Taoyuan (TW)

( * ) Notice: Subject to any disclaimer, the term of this patent is extended or adjusted under 35 U.S.C. 154(b) by 87 days.

(21) Appl. No.: 16/691,618

(22) Filed: Nov. 22, 2019

(65) Prior Publication Data

US 2020/0181445 A1 Jun. 11, 2020

(30) Foreign Application Priority Data

Dec. 10, 2018 (TW) .................. 107144254

(51) Int. Cl.
| | | |
|---|---|---|
| *C09D 163/00* | (2006.01) | |
| *C08G 59/24* | (2006.01) | |
| *C08G 59/42* | (2006.01) | |
| *H01L 51/52* | (2006.01) | |
| *H01L 51/00* | (2006.01) | |
| *C08G 59/68* | (2006.01) | |

(52) U.S. Cl.
CPC .......... *C09D 163/00* (2013.01); *C08G 59/245* (2013.01); *C08G 59/4223* (2013.01); *C08G 59/688* (2013.01); *H01L 51/004* (2013.01); *H01L 51/5253* (2013.01); *H01L 2251/5338* (2013.01)

(58) Field of Classification Search
CPC ................ C09D 163/00; C08G 59/245; C08G 59/4223; C08G 59/688; H01L 51/004; H01L 51/5253; H01L 2251/5338
USPC ........................................................ 525/523
See application file for complete search history.

(56) References Cited

FOREIGN PATENT DOCUMENTS

| CN | 104302686 | 1/2015 | |
|---|---|---|---|
| CN | 104955866 | 9/2015 | |
| CN | 105473634 | 4/2016 | |
| JP | 2004156024 | 6/2004 | |
| JP | 2006176658 | 7/2006 | |
| TW | 200427722 | 12/2004 | |
| TW | 201319159 | 5/2013 | |
| TW | I572664 | 3/2017 | |
| TW | 201738291 | 11/2017 | |
| WO | WO-2015060439 A1 * | 4/2015 | ............ C09J 163/00 |

OTHER PUBLICATIONS

Furuta et al., WO 2015/060439 A1 machine translation in English, Apr. 30, 2015 (Year: 2015).*
"Notice of allowance of Taiwan Counterpart Application", dated Feb. 20, 2020, p. 1-p. 4.
"Office Action of China Counterpart Application", dated Jul. 1, 2021, p. 1-p. 8.

* cited by examiner

*Primary Examiner* — David T Karst
(74) *Attorney, Agent, or Firm* — JCIPRNET

(57) ABSTRACT

A flexible encapsulating material, a method for preparing the flexible encapsulating material, and an encapsulating method using the flexible encapsulating material are provided. The flexible encapsulating material includes an epoxy resin represented by a Formula (1), a curing agent, and a curing accelerator and optionally includes a coupling agent, wherein based on 100 parts by weight of a total usage amount of the epoxy resin (A), the curing agent (B), and the curing accelerator (C), a usage amount of the epoxy resin (A) is 85 parts by weight or more, and based on 100 parts by weight of the usage amount of the epoxy resin (A), a usage amount of the coupling agent (D) is 0 to 5 parts by weight.

(1)

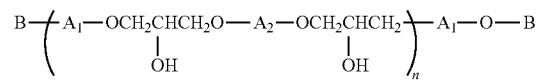

11 Claims, No Drawings

FLEXIBLE ENCAPSULATING MATERIAL, PROCESS FOR PREPARING THE SAME AND ENCAPSULATING METHOD USING THE SAME

CROSS-REFERENCE TO RELATED APPLICATION

This application claims the priority benefit of Taiwan application serial no. 107144254, filed on Dec. 10, 2018. The entirety of the above-mentioned patent application is hereby incorporated by reference herein and made a part of this specification.

BACKGROUND

Technical Field

The present invention relates to an encapsulating material, and more particularly to a flexible encapsulating material, a method for preparing the same, and an encapsulating method using the same.

Description of Related Art

In recent years, organic light emitting diode (OLED) panels are widely used in many display fields, for example, TV, computer screen, laptop and mobile phone because of the advantages of self-luminous, wide viewing angle, short reaction time, high efficiency, power saving, high brightness, etc. In particular, the flexible organic light-emitting diode panel is the most popular.

In general, flexible organic light-emitting diode panels should be thin, flexible, and even foldable, so conventional glass materials are not suitable for use in encapsulating such devices. Most of the conventional encapsulating materials employ epoxy resins having film formability, adhesion, and high molecular weight, but such encapsulating materials still have disadvantages such as low glass transition temperature (Tg), low optical transparency, and insufficient flexibility. Therefore, how to improve the above properties is an issue to be studied.

SUMMARY

In view of the above, the disclosure provides various encapsulating materials which have good volume shrinkage, optical transparency, flexibility, moisture resistance and adhesion as well as a certain glass transition temperature (90° C. or higher). In particular, the encapsulating material in one embodiment may be used for a whole surface encapsulation, and is suitable for encapsulating a flexible organic light-emitting diode panel.

A flexible encapsulating material in one embodiment comprises an epoxy resin (A) represented by a formula (1), a curing agent (B), a curing accelerator (C), and optionally a coupling agent (D), wherein based on 100 parts by weight of a total usage amount of the epoxy resin (A), the curing agent (B), and the curing accelerator (C), a usage amount of the epoxy resin (A) is 85 parts by weight or more, and based on 100 parts by weight of a usage amount of the epoxy resin (A), a usage amount of the coupling agent (D) is greater than or equal to 0 parts by weight and less than 5 parts by weight.

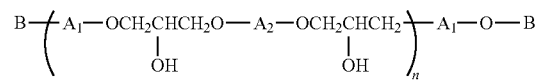

in the formula (1), $A_1$ is a group selected from the group consisting of groups represented by a formula (a-1), a formula (a-2) and a formula (a-3),

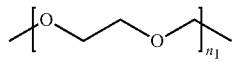

in the formula (a-1), $n_1$ is an integer of 1 to 8,

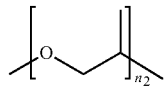

in the formula (a-2), $n_2$ is an integer of 1 to 8,

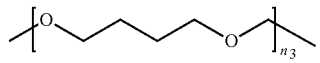

in the formula (a-3), $n_3$ is an integer of 1 to 8,
$A_2$ is a divalent organic group having an aromatic structure, an alicyclic structure, or both,
B is a glycidyl group, and
n is an integer of 1 or more.

In an embodiment of the invention, based on 100 parts by weight of the usage amount of the epoxy resin (A), the usage amount of the coupling agent (D) is 0.1 to 2 parts by weight.

In an embodiment of the invention, based on 100 parts by weight of the usage amount of the epoxy resin (A), a usage amount of the curing agent (B) is 5 to 12 parts by weight and a usage amount of the curing accelerator (C) is 0.01 to 0.1 parts by weight.

In an embodiment of the invention, $A_2$ is a group represented by a formula (3),

in the formula (3), X is a single bond or a C1-C3 divalent hydrocarbon group.

In an embodiment of the invention, the epoxy resin (A) has a weight average molecular weight of 8,000 to 14,000 g/mol.

In an embodiment of the invention, the flexible encapsulating material has a weight average molecular weight of 13,000 to 35,000 g/mol.

The disclosure also provides a variety of methods for preparing a flexible encapsulating material comprising: mixing an epoxy resin (A) represented by the above formula (1), a curing agent (B), a curing accelerator (C) and a solvent (E) to form a mixture, reacting the mixture at an elevated temperature of 100° C. or higher to form a resin composition; and adding a coupling agent (D) to the resin composition to form the flexible encapsulating material.

The disclosure also provides a variety of encapsulating methods comprising: applying the flexible encapsulating material to a cover plate; and attaching the flexible encapsulating material to a substrate with an electronic component. Thereby, the flexible encapsulating material covers the electronic component, and the flexible encapsulating material is located between the cover plate and the substrate with the electronic component.

In an embodiment of the invention, the method further comprises: before attaching the flexible encapsulating material to the substrate with the electronic component, covering the electronic component with a gas barrier layer.

In an embodiment of the invention, the electronic component is a display component.

In view of above, the flexible encapsulating material in one embodiment which includes a specific epoxy resin, a curing agent, and a curing accelerator has good volume shrinkage, optical transparency, flexibility, moisture resistance and adhesion as well as a certain glass transition temperature (90° C. or higher) and is suitable for encapsulating flexible organic light emitting diode panels.

To make the aforementioned more comprehensible, several embodiments accompanied with drawings are described in detail as follows.

DESCRIPTION OF THE EMBODIMENTS

The disclosure provides a variety of flexible encapsulating materials for encapsulating a flexible organic light emitting diode panel, which has good volume shrinkage, optical transparency, flexibility, moisture resistance and adhesion as well as a certain glass transition temperature (90° C. or higher). Hereinafter, embodiments are provided as examples of actual implementation of the invention. However, these embodiments are illustrative, and the invention is not limited thereto.

Flexible Encapsulating Material

The disclosure provides a flexible encapsulating material comprising an epoxy resin (A), a curing agent (B), and a curing accelerator (C). In addition, the flexible encapsulating material may further include at least one of a coupling agent (D) and a solvent (E), if necessary. Hereinafter, the individual components mentioned above will be described in detail.

Epoxy Resin (A)

The epoxy resin (A) used in the flexible encapsulating material in one embodiment is a compound represented by a formula (1). Compared to the conventional encapsulating material using a combination of a plurality of epoxy resins, the flexible encapsulating material in one embodiment may achieve sufficient flexibility using a single epoxy resin.

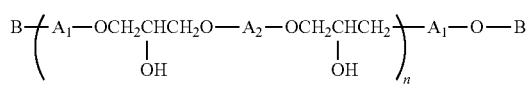

(1)

in the formula (1), $A_1$ is a group selected from the group consisting of groups represented by a formula (a-1), a formula (a-2) and a formula (a-3),

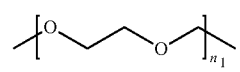

(a-1)

in the formula (a-1), $n_1$ may be an integer of 1 to 8, preferably an integer of 1 to 4, and more preferably an integer of 1 to 2,

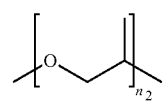

(a-2)

in the formula (a-2), $n_2$ may be an integer of 1 to 8, preferably an integer of 1 to 4, and more preferably an integer of 1 to 2,

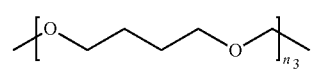

(a-3)

in the formula (a-3), $n_3$ may be an integer of 1 to 8, preferably an integer of 1 to 4, and more preferably an integer of 1 to 2.

In the formula (1), $A_2$ is a divalent organic group having an aromatic structure, an alicyclic structure, or both. The aromatic structure is not particularly limited, and may be an aromatic ring such as a benzene ring, a naphthalene ring, an anthracene ring, a phenanthrene ring, an fluorene ring, a triphenylene ring, a pyrene ring, a naphthacene ring, a biphenyl ring or a terphenyl ring, preferably a benzene ring. The alicyclic structure is not particularly limited, and may be a cyclopentane ring or a cyclohexane ring, preferably a cyclohexane ring.

In addition, $A_2$ may be a divalent organic group comprising at least one aromatic ring or a divalent organic group comprising at least one alicyclic ring. $A_2$ is preferably a divalent organic group comprising at least two aromatic rings or a divalent organic group comprising at least two alicyclic rings. $A_2$ is more preferably a group represented by a formula (3).

(3)

in the formula (3), X may be a single bond or a divalent hydrocarbon group having a carbon number of 1 to 3, preferably

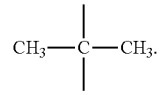

In the formula (1), B may be a glycidyl group.

In the formula (1), n may be an integer of 1 or more.

When used in the flexible encapsulating material in one embodiment, the epoxy resin (A) may have a weight average molecular weight of, for example, 6,000 to 12,000 g/mol, preferably 9,000 to 12,000 g/mol.

In the flexible encapsulating material in one embodiment, based on 100 parts by weight of a total usage amount of the epoxy resin (A), the curing agent (B) and the curing accelerator (C), a usage amount of the epoxy resin (A) is 85 parts by weight or more, preferably 89 parts by weight or more, more preferably 91 parts by weight or more.

When the usage amount of the epoxy resin (A) in the encapsulating material is within the above range, the flexibility of the encapsulating material is good. When the usage amount of the epoxy resin (A) in the encapsulating material is less than 85 parts by weight, the encapsulating material does not have sufficient flexibility required for the whole surface encapsulation.

Curing Agent (B)

The curing agent (B) is used to perform a crosslinking reaction with the epoxy resin (A) to form a network polymer served as a flexible encapsulating material. The curing agent (B) is not particularly limited, and a curing agent known in the art may be used. For example, the curing agent (B) may be an aromatic polyamine, dicyandiamide or an acid anhydride such as hexahydrophthalic anhydride (HHPA), preferably HHPA.

In the flexible encapsulating material in one embodiment, based on 100 parts by weight of a usage amount of the epoxy resin (A), a usage amount of the curing agent (B) may be 5 to 12 parts by weight, preferably 7 to 10 parts by weight. When the usage amount of the curing agent (B) in the flexible encapsulating material falls within this range, the adhesion (tension) of the encapsulating material to a cover plate or a substrate and the flexibility of the flexible encapsulating material may be improved. When the usage amount of the curing agent (B) in the flexible encapsulating material is less than 5 parts by weight, the adhesion of the flexible encapsulating material to the cover plate or the substrate is not good. When the usage amount of the curing agent (B) in the flexible encapsulating material is more than 12 parts by weight, the molecular weight of the flexible encapsulating material may be overhigh due to an overhigh crosslink density, resulting in embrittlement of the flexible encapsulating material, poor adhesion, and poor flexibility.

Curing Accelerator (C)

The curing accelerator (C) is used to lower the activation energy and to promote the progress of the crosslinking reaction between the epoxy resin (A) and the curing agent (B). That is, the curing accelerator (C) is served as a catalyst for the crosslinking reaction. The curing accelerator (C) is not particularly limited, and a curing accelerator known in the art may be used. For example, the curing accelerator (C) may be an imidazole-based compound, an amine-based compound, or tertiary phosphines such as triphenylphosphine (TPP), preferably TPP.

In the flexible encapsulating material in one embodiment, based on 100 parts by weight of a usage amount of the epoxy resin (A), a usage amount of the curing accelerator (C) may be 0.01 to 0.1 part by weight, preferably about 0.01 part by weight. When the usage amount of the curing accelerator (C) in the flexible encapsulating material falls within this range, the flexibility of the flexible encapsulating material may be improved. When the usage amount of the curing accelerator (C) in the flexible encapsulating material is less than 0.01 part by weight, the reactivity for forming the flexible encapsulating material is poor. When the usage amount of the curing accelerator (C) in the flexible encapsulating material is more than 0.1 part by weight, the flexibility of the flexible encapsulating material may be lowered.

Coupling Agent (D)

The flexible encapsulating material of the invention may optionally include a coupling agent (D). The coupling agent (D) is not particularly limited, and a coupling agent known in the art may be used. For example, the coupling agent (D) may be a silane-based coupling agent such as γ-glycidoxypropyltrimethoxysilane, γ-glycidoxypropylmethyldiethoxysilane, β-(3,4-epoxycyclohexyl)ethyltrimethoxysilane, γ-(methacryloylpropyl)trimethoxysilane, γ-aminopropyltrimethoxysilane, N-βP-(aminoethyl)-Γ-aminopropyltrimethoxysilane, Nβ-(aminoethyl)-γ-aminopropylmethyl dimethoxysilane, N-β-(aminoethyl)-γ-aminopropylmethyl diethoxysilane, N-phenyl-γ-aminopropyltrimethoxysilane, γ-ureidopropyltriethoxysilane, γ-mercaptopropyltrimethoxysilane, γ-mercaptopropylmethyldimethoxysilane, bis(3-triethoxysilylpropyl)tetrasulfide, methyltrimethoxysilane, methyltriethoxysilane, vinyltrimethoxysilane, vinyltriacetoxysilane and imidazole-silane. These coupling agents may be used alone or in a combination of two or more.

In the flexible encapsulating material, based on 100 parts by weight of a usage amount of the epoxy resin (A), a usage amount of the coupling agent (D) in the flexible encapsulating material may be greater than or equal to 0 part by weight and less than 5 parts by weight, preferably 0.1 to 2 parts by weight, more preferably 0.5 to 1.5 parts by weight, particularly preferably 0.9 to 1.1 parts by weight. When the usage amount of the coupling agent (D) in the flexible encapsulating material is less than 5 parts by weight, the adhesion of the flexible encapsulating material may be improved while good optical transparency of the flexible encapsulating material is secured. In particular, when the usage amount of the coupling agent (D) in the flexible encapsulating material is 0.1 to 2 parts by weight, both of the adhesion and flexibility of the flexible encapsulating material may be improved while good optical transparency of the flexible encapsulating material is secured. In addition, when the usage amount of the coupling agent (D) in the flexible encapsulating material is 5 parts by weight or more, crystallization may occur in the flexible encapsulating material, resulting in a decrease in optical transparency.

Solvent (E)

The flexible encapsulating material may optionally include a solvent (E). The solvent is not particularly limited, and examples thereof include a (poly)alkylene glycol monoalkyl ether such as ethylene glycol monomethyl ether, ethylene glycol monoethyl ether, diethylene glycol monomethyl ether, diethylene glycol monoethyl ether, diethylene glycol n-propyl ether, diethylene glycol n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol n-propyl ether, dipropylene glycol n-butyl ether, tripropylene glycol monoethyl ether, and tripropylene glycol monoethyl ether; a (poly)alkylene glycol monoalkyl ether acetate such as ethylene glycol monomethyl ether acetate, ethylene glycol monoethyl ether acetate, propylene glycol monomethyl ether acetate (PGMEA), and propylene glycol monoethyl ether acetate; other ethers such as diethylene glycol dimethyl ether, diethylene glycol methyl ethyl ether, diethylene glycol diethyl ether, and tetrahydrofuran; a ketone such as methyl ethyl ketone, cyclohexanone, 2-heptanone, and 3-heptanone; an alkyl lactate such as methyl 2-hydroxypropanoate and ethyl 2-hydroxypropanoate; other esters such as methyl 2-hydroxy-2-methylpropanoate, ethyl 2-hydroxy-2-methylpropanoate, methyl 3-methoxypropanoate, ethyl 3-methoxypropanoate, methyl 3-ethoxypropanoate, ethyl 3-ethoxypropanoate (EEP), ethyl ethoxyacetate, ethyl hydroxyacetate, methyl 2-hydroxy-3-methylenebutyrate, 3-methyl-3-methoxybutyl acetate, 3-methyl-3-methoxybutyl propanoate, ethyl acetate, n-propyl acetate, isopropyl acetate, n-butyl acetate, isobutyl acetate, n-amyl acetate, isoamyl acetate, n-butyl propanoate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, and ethyl 2-oxybutyrate; an aromatic hydrocarbon such as toluene or xylene; or an amine such as N-methylpyrrolidone, N,N-dimethylformamide, or N,N-dimethylacetamide. These solvents may be used alone or in a combination of two or more.

In the preparation of the flexible encapsulating material in one embodiment, the solvent is suitably added in an amount of from 0% by weight to 60% by weight, more preferably from 10% by weight to 50% by weight.

The amount of solvent added may be adjusted depending on the desired solid content. For example, in the preparation of the epoxy resin (A) of the flexible encapsulating material in one embodiment, the solid content is preferably from 40% by weight to 100% by weight. Too low the solid content results in poor reactivity, and too high the solid content results in poor fluidity. During the coating process of the flexible encapsulating material, the solid content of the flexible encapsulating material is preferably from 20% by weight to 40% by weight to facilitate coating.

In addition, the flexible encapsulating material may include other additives, if necessary.

The flexible encapsulating material in one embodiment may have a weight average molecular weight of from 13,000 to 35,000 g/mol, preferably from 17,000 to 30,000 g/mol, more preferably from 17,000 to 25,000 g/mol. When the weight average molecular weight is too small, the crosslink density is too low, resulting in an increase in water absorption, which makes the moisture resistance of the encapsulating material worse, thereby causing a dark spot on a display made with the encapsulating material and reducing the service life of the product. In addition, when the weight average molecular weight is less than 13,000 g/mol, the adhesion of the encapsulating material is also lowered. When the weight average molecular weight is too large, the crosslink density is too high, resulting in embrittlement of the polymer, so that the Young's modulus increases and the flexibility decreases. In addition, when the weight average molecular weight is too large, the gelation of the polymer may cause the adhesion of the encapsulating material to decrease.

On the other hand, the glass transition temperature of the flexible encapsulating material in one embodiment is simply required to be greater than 90° C. so that the phase change of the polymer does not occur, and the processability of the subsequent process is secured. The glass transition temperature is related to the crosslink density (reactivity), and the higher the crosslink density (reactivity), the higher the glass transition temperature. Conversely, the worse the crosslink density (reactivity), the lower the glass transition temperature. According to the above, when the glass transition temperature is too low, the moisture resistance and adhesion of the encapsulating material are poor, and the processability of the subsequent process is not good; when the glass transition temperature is too low, the encapsulating material has poor flexibility and adhesion.

Method for Preparing Flexible Encapsulating Material

In an embodiment, a method for preparing a flexible encapsulating material comprises the following steps (I) and (II).

Step (I): The epoxy resin (A) represented by the above formula (1), the curing agent (B), and the curing accelerator (C) are mixed with the solvent (E) to carry out a polymerization, thereby forming a resin composition. The method of mixing is not particularly limited, and for example, a heating stirrer may be used. The reaction temperature of the step (I) may be 100° C. or more, preferably 100 to 150° C., more preferably 110 to 130° C. The reaction time of the step (I) may vary depending on the ratio of the epoxy resin (A), the curing agent (B), and the curing accelerator (C). Specifically, the reaction time of the step (I) may be 8 to 14 hours.

Step (II): The coupling agent (D) is added to the resin composition to form a flexible encapsulating material. The reaction temperature of the step (II) may be the same as the reaction temperature of the step (I). The reaction time of the step (II) may vary depending on the ratio of the epoxy resin (A), the curing agent (B), the curing accelerator (C), and the coupling agent (D). Specifically, the reaction time of the step (II) may be 30 minutes or longer, preferably 40 minutes to 180 minutes.

Encapsulating Method

The disclosure provides an encapsulating method comprising the following steps. First, the flexible encapsulating material described above is applied to a cover plate. Next, the flexible encapsulating material is further attached to a substrate with an electronic component to cover the electronic component. Therefore, the flexible encapsulating material is located between the cover plate and the substrate with the electronic component. Furthermore, the encapsulating method in one embodiment may substantially form a structure in which the substrate, the electronic component, the flexible encapsulating material, and the cover plate are sequentially arranged from bottom to top.

The flexible encapsulating material may be applied to the cover plate by directly applying the above-mentioned flexible encapsulating material to the cover plate, or by a method of using a three-layered adhesive material as described below.

The method of attaching the flexible encapsulating material to the substrate with the electronic component may be performed by, for example, directly attaching the surface of the cover plate coated with the flexible encapsulating material to the substrate with the electronic component, or by the method of using a three-layered adhesive material as described below.

The electronic component may be covered with the flexible encapsulating material partially or completely. In order to take advantage of the flexible encapsulating material, it is preferable to cover the electronic component completely, and it is more preferable to cover the entire surface of the substrate.

The electronic component may be, for example, a display element or the like. In addition, before the flexible encapsulating material is attached to the substrate with the electronic component, a step of covering the electronic component with a gas barrier layer may be further included.

It should be noted that the flexible encapsulating material in one embodiment may be applied to a rigid panel as well as to a flexible panel. In addition, since the encapsulating material in one embodiment is excellent in flexibility (bending resistance), cracking or a decrease in adhesive strength may not occurred when the encapsulating material in one embodiment is applied to a flexible panel. As may be seen, in order to take advantage of the flexible encapsulating material, it is preferably applied to a flexible panel in which both of the cover plate and the substrate are flexible.

In an embodiment, the encapsulating method by using a three-layered adhesive material comprises the following steps. First, the flexible encapsulating material is coated on a first release film. The coating method is not particularly limited, and may be, for example, a slit coating, a knife coating, a dip coating, a die coating, a bar coating, or a curtain flow coating. After the solvent is removed by baking, a second release film is attached to the flexible encapsulating material to obtain a three-layered adhesive material composed of the first release film, the flexible encapsulating material, and the second release film (similar to the construction of double-sided tape). The base materials of the first and the second release films may be, for example, a polyethylene terephthalate (PET) film. Next, the first release film was peeled off, and the adhesive material was transferred onto a cover plate at 70° C. Then, the second release film is peeled off and the adhesive material is attached onto a substrate with an electronic component via a vacuum laminating machine.

Hereinafter, the flexible encapsulating material and the method for preparing the same of the above embodiments will be described in detail by way of experimental examples. However, the following experimental examples are not intended to limit the invention.

Experimental Example

Preparation of Epoxy Resin (A)

Preparation of Epoxy Resin A1

80 parts by weight of glycidol, 100 parts by weight of bisphenol A, 0.5 part by weight of catalyst (20% aqueous solution of tetramethylammonium hydroxide) were mixed in the reaction vessel, and a polymerization reaction was performed at 150° C. for 4 hours under nitrogen to obtain an epoxy resin intermediate. Then, 100 parts by weight of the epoxy resin intermediate, 100 parts by weight of 1,2-dimethoxyethane (for formula a-1), 20 parts by weight of isobutanol (for formula a-2), 10 parts by weight of glycidol, 0.5 part by weight of catalyst (20% aqueous solution of tetramethylammonium hydroxide) were mixed in the reaction vessel, and a polymerization reaction was performed at 80° C. for 6 hours under nitrogen to obtain epoxy resin A1. The weight average molecular weight was 9,150 as measured by a gel permeation meter of model HLC8320.

Preparation of Epoxy Resin A2

80 parts by weight of glycidol, 100 parts by weight of bisphenol A, 0.5 part by weight of catalyst (20% aqueous solution of tetramethylammonium hydroxide) were mixed in the reaction vessel, and a polymerization reaction was performed at 150° C. for 4 hours under nitrogen to obtain an epoxy resin intermediate. 100 parts by weight of the epoxy resin intermediate, 100 parts by weight of 1,4-dimethoxybutane (for formula a-3), 20 parts by weight of isobutanol (for formula a-2), 10 parts by weight of glycidol, 0.5 part by weight of catalyst (20% aqueous solution of tetramethylammonium hydroxide) were mixed in the reaction vessel, and a polymerization reaction was performed at 80° C. for 6 hours under nitrogen to obtain epoxy resin A2. The weight average molecular weight was 9,500 as measured by a gel permeation meter of model HLC8320.

Preparation of Flexible Encapsulating Materials

The encapsulating materials of Examples 1 to 5 and Comparative Examples 1 to 3 were prepared in accordance with the usage amounts shown in Table 1 below.

First, in the reaction vessel, hexahydrophthalic anhydride (HHPA) as a curing agent and triphenylphosphine (TPP) as a curing accelerator were added to an epoxy resin and the result was stirred uniformly. Propylene glycol monomethyl ether acetate (PGMEA) was added, and the solid content was adjusted as listed in Table 1 to form an epoxy resin solution. Then, the reaction was performed under nitrogen at 120° C. for 10 hours in an oil bath. Thereafter, glycidoxypropyltrimethoxysilane (KBM-403, Shin-Etsu Chemical Co., Ltd.) was added as a coupling agent. The reaction was quenched after 40 minutes to obtain an encapsulating material.

TABLE 1

| Example | Epoxy resin (parts by weight) A1 | A2 | HHPA (parts by weight) | TPP (parts by weight) | Coupling agent (parts by weight) | PGMEA (wt %) | Solid content (wt %) (A1 + A2 + HHPA + TPP + PGMEA) |
|---|---|---|---|---|---|---|---|
| Example 1 | 50 | 50 | 5 | 0.01 | 1 | 0 | 100 |
| Example 2 | 50 | 50 | 8 | 0.01 | 1 | 60 | 40 |
| Example 3 | 100 | 0 | 8 | 0.1 | 1 | 50 | 50 |
| Example 4 | 0 | 100 | 12 | 0.01 | 1 | 30 | 70 |
| Example 5 | 50 | 50 | 5 | 0.01 | 0 | 0 | 100 |
| Comparative example 1 | 100 | 0 | 8 | 0 | 1 | 50 | 50 |
| Comparative example 2 | 50 | 50 | 8 | 0.01 | 5 | 60 | 40 |
| Comparative example 3 | 0 | 100 | 18 | 0.01 | 1 | 30 | 70 |

Evaluation

The encapsulating materials of Examples 1 to 5 and Comparative Examples 1 to 3 were evaluated according to the following methods, and the results are shown in Table 2.

1. Glass Transition Temperature (Tg)

The glass transition temperature was measured by using the Diamond-DSC (PerkinElmer, Inc.). The value of the intermediate point in the second run of heating was used as the glass transition temperature (Tg).

Sample amount: 10 mg
Heating rate: 5° C./min
Temperature range: 0° C. to 200° C. (heating, cooling, heating)
Environmental conditions: under a nitrogen stream

2. Weight Average Molecular Weight

The weight average molecular weight (Mw) was obtained by using a calibration line made with a commercially available standard polystyrene, and was measured by using a gel permeation chromatography (GPC, Waters Corporation) with functions of differential refractive detection and light scattering detection.

3. Volume Shrinkage

The encapsulating material is made into a block, and the weight of the encapsulating material in air and water before and after curing was measured by a specific gravity balance respectively, and the temperature of water was recorded, and the volume shrinkage (SV) was calculated by the following equation.

$$SV=(V_1-V_0)/V_1 \times 100$$

In the equation, $V_0$ represents the specific gravity before the curing, and $V_1$ represents the specific gravity after the curing.

Volume shrinkage may be used to evaluate volume changes before and after curing. In general, lower volume shrinkage is preferred.

The evaluation criteria for volume shrinkage are as follows:

○: volume shrinkage≤2%
X: 2%<volume shrinkage.

4. Optical Transparency

The optical transparency (T %) of the encapsulating material at a wavelength of 550 nm was measured after the encapsulating material was applied to plain glass. When the encapsulating material is applied to a display, higher optical transparency is preferred.

The evaluation criteria for optical transparency are as follows:

◎: transparency≥97%
○: 95%<transparency<97%
X: transparency≤95%.

5. Young's Modulus

The encapsulating material was made into a block. The block was stretched by a two-column tensile tester to obtain the stress and strain of the block to calculate Young's modulus. Young's modulus may be used to evaluate the flexibility of the encapsulating material. The smaller the Young's modulus, the higher the flexibility. The larger the Young's modulus, the worse the flexibility.

The evaluation criteria for Young's modulus are as follows:

◎: Young's modulus≤20 Mpa;
○: 20 Mpa<Young's modulus<50Mpa;
X: 50 Mpa<Young's modulus.

6. Water Absorption

The encapsulating material was made into a block. The water absorption of the block was calculated by the difference in weight before and after the block was placed in the water for 24 hours at room temperature of 25° C. measured with a four-digit scale. Water absorption may be used to evaluate the moisture resistance of the encapsulating material. When the water absorption is smaller, it indicates that the moisture resistance of the encapsulating material is better, which may effectively prevent dark spots from occurring on a display and prolong the service life of the product. Conversely, when the water absorption is larger, it means that the moisture resistance of the encapsulating material is not good, resulting in dark spots on the display and shorter service life of the product.

The evaluation criteria for water absorption are as follows:

◎: water absorption≤1%
○: 1%<water absorption<3%
X: 3%≤water absorption.

7. Peel Strength

The encapsulating material was applied to a polyimide (PI) substrate at 70° C. Then the encapsulating material applied to the polyimide substrate was further attached to another polyimide substrate at 80° C. to obtain a test sheet. The peel strength was measured by a two-column tensile tester on the test sheet. The peel strength may be used to evaluate the adhesion (tension) of the encapsulating material to the cover plate or substrate. The greater the peel strength, the better the adhesion of the encapsulating material. Conversely, when the peel strength is smaller, it means that the adhesion of the encapsulating material is poor.

The evaluation criteria for peel strength are as follows:

◎: 1.4 kgf≤peel strength;
○: 1.2 kgf≤peel strength<1.2 kgf;
Δ: 1.0 kgf≤peel strength<1.2 kgf;
X: Peel strength≤1.0 kgf.

8. Bending Test

The encapsulating material was applied to a polyimide (PI) substrate at 70° C. Then the encapsulating material applied to the polyimide substrate was further attached to another polyimide substrate to obtain a test sheet. A bending test (bending radius is 10 mm, bending times is 1,500) was performed on the test sheet. The flexibility of the encapsulating material was evaluated by observing whether the test sheet restored to the original shape after the test using an optical microscope (Model: Optima ML-903).

The evaluation criteria for flexibility are as follows:

○: restoring to the original shape after the test
X: not restoring to the original shape after the test.

9. Outgassing Test

The encapsulating material was placed in a closed space at 100° C. for 1 hour. The outgassing amount was measured by a gas chromatography mass spectrometer (GC-MS6890N (G1530N)/Agilent and TurboMatrix 350 ATD/PerkinElmer). When the outgassing amount is smaller, dark spots may be effectively prevented from occurring on a display and the service life of the product may be extended. Conversely, when the outgassing amount is larger, dark spots may occur on the display and the service life of the product may decrease.

The evaluation criteria for the outgassing test are as follows:

○: outgassing amount≤50 ppm
X: 50 ppm≤outgassing amount.

TABLE 2

|  | Tg (° C.) | Molecular weight | Volume Shrinkage | Optical transparency | Young's modulus | Water absorption | Peel strength | Bending test | Outgassing test |
|---|---|---|---|---|---|---|---|---|---|
| Example 1 | 94 | 17,616 | ○ | ◎ | ◎ | ○ | ○ | ○ | ○ |
| Example 2 | 101 | 20,768 | ○ | ◎ | ◎ | ○ | ◎ | ○ | ○ |
| Example 3 | 102 | 21,058 | ○ | ◎ | ○ | ○ | ◎ | ○ | ○ |
| Example 4 | 107 | 30,454 | ○ | ○ | ○ | ◎ | ○ | ○ | ○ |
| Example 5 | 90 | 13,414 | ○ | ◎ | ◎ | ○ | Δ | ○ | ○ |
| Comparative example 1 | 75 | 11,175 | X | ◎ | ◎ | X | X | ○ | X |
| Comparative example 2 | 102 | 23,911 | ○ | X | ◎ | ○ | Δ | ○ | ○ |
| Comparative example 3 | 112 | 34,982 | ○ | ○ | X | ◎ | X | X | ○ |

As shown in Table 2 above, Examples 1 to 5 of the encapsulating materials prepared according to the formulation of one or more embodiments of the present invention have good volume shrinkage, optical transparency, Young's modulus, water absorption and peel strength. In contrast, when the ingredients of the encapsulating material were not in the proportions of the formulations of one or more embodiments of the present invention, these effects cannot be achieved at the same time. Specifically, for Comparative Example 1 without using the curing accelerator, the reactivity of the polymerization was poor, so the weight average molecular weight was low, resulting in poor volume shrinkage, water absorption, and peel strength, which also means that the moisture resistance and adhesion of the encapsulating material of Comparative Example 1 are poor. For Comparative Example 2 with excess amount of the coupling agent, crystallization was occurred, resulting in poor optical transparency. For Comparative Example 3 with excess amount of the curing agent, the crosslink density of the polymer was too high, resulting in embrittlement of the polymer, which further deteriorated flexibility and adhesion.

Example 1 with a coupling agent exhibited better peel strength than Example 5 without the coupling agent. It may be seen that when the coupling agent is used, the adhesion of the encapsulating material is strengthened.

In addition, Example 2 with 8 parts by weight of the curing agent exhibited better peel strength than Example 1 with 5 parts by weight of curing agent. It may be seen that when the usage amount of the curing agent is about 8 parts by weight, the adhesion of the encapsulating material is strengthened.

In addition, compared to Example 4 with 12 parts by weight of the curing agent, the molecular weight of the polymer was well-controlled in Example 2 with 8 parts by weight of the curing agent. Thus, better Young's modulus and peel strength were obtained. It may be seen that when the usage amount of the curing agent is about 8 parts by weight, the adhesion and flexibility of the encapsulating material are also improved.

On the other hand, compared to Example 3 with 0.1 part by weight of the curing accelerator, Example 2 with 0.01 part by weight of the curing accelerator exhibited better Young's modulus. It may be seen that when the usage amount of the curing accelerator is about 0.01 part by weight, the flexibility of the encapsulating material was improved.

In summary, the flexible encapsulating material in one embodiment which includes an epoxy resin represented by the formula (1), a curing agent and a curing accelerator, has good volume shrinkage, optical transparency, flexibility, moisture resistance and adhesion as well as a glass transition temperature of 90° C. or higher. Therefore, the flexible encapsulating material in one embodiment is suitable for encapsulating flexible organic light-emitting diode panels.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A flexible encapsulating material, comprising:
an epoxy resin (A) represented by a formula (1),

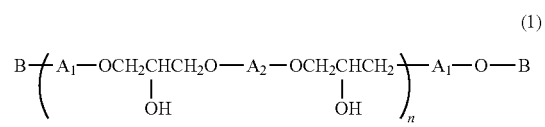

in the formula (1), $A_1$ is a group selected from the group consisting of groups represented by a formula (a-1), a formula (a-2) and a formula (a-3),

in the formula (a-1), $n_1$ is an integer of 1 to 8,

in the formula (a-2), $n_2$ is an integer of 1 to 8,

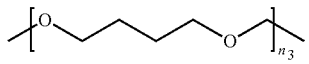
(a-3)

in the formula (a-3), $n_3$ is an integer of 1 to 8,
$A_2$ is a divalent organic group having at least one of an aromatic structure and an alicyclic structure,
B is a glycidyl group,
n is an integer of 1 or more;
a curing agent (B); and
a curing accelerator (C),
wherein, based on 100 parts by weight of a total usage amount of the epoxy resin (A), the curing agent (B), and the curing accelerator (C), a usage amount of the epoxy resin (A) is 85 parts by weight or more, and
the flexible encapsulating material comprises a coupling agent (D) in a usage amount of greater than or equal to 0 part by weight and less than 5 parts by weight based on 100 parts by weight of the usage amount of the epoxy resin (A).

2. The flexible encapsulating material of claim 1, wherein the usage amount of the coupling agent (D) is 0.1 to 2 parts by weight.

3. The flexible encapsulating material of claim 2, wherein based on 100 parts by weight of the usage amount of the epoxy resin (A), a usage amount of the curing agent (B) is 5 to 12 parts by weight, and a usage amount of the curing accelerator (C) is 0.01 to 0.1 part by weight.

4. The flexible encapsulating material of claim 1, wherein $A_2$ is a group represented by a formula (3),

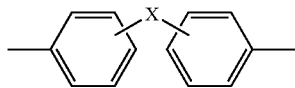
(3)

in the formula (3), X is a single bond or a C1-3 divalent hydrocarbon group.

5. The flexible encapsulating material of claim 1, wherein the epoxy resin (A) has a weight average molecular weight of 8,000 to 14,000 g/mol.

6. The flexible encapsulating material of claim 1, wherein the flexible encapsulating material has a weight average molecular weight of 13,000 to 35,000 g/mol.

7. An encapsulating method comprising:
applying the flexible encapsulating material of claim 1 to a cover plate; and
attaching the flexible encapsulating material to a substrate with an electronic component to cover the electronic component,
wherein the flexible encapsulating material is located between the cover plate and the substrate with the electronic component.

8. The encapsulating method of claim 7, further comprising covering the electronic component with a gas barrier layer before attaching the flexible encapsulating material to the substrate with the electronic component.

9. The encapsulating method of claim 7, wherein the electronic component is a display component.

10. A method for preparing a flexible encapsulating material, comprising:
mixing an epoxy resin (A) represented by a formula (1), a curing agent (B), a curing accelerator (C) and a solvent (E) to form a mixture,
wherein based on 100 parts by weight of a total usage amount of the epoxy resin (A), the curing agent (B), and the curing accelerator (C), a usage amount of the epoxy resin (A) is 85 parts by weight or more
reacting the mixture at an elevated temperature of 100° C. or higher to form a resin composition; and
adding a coupling agent (D) to the resin composition to form the flexible encapsulating material, wherein the coupling agent (D) is in a usage amount of greater than or equal to 0 part by weight and less than 5 parts by weight based on 100 parts by weight of the usage amount of the epoxy resin (A),

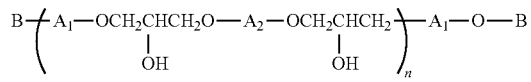
(1)

in the formula (1), $A_1$ is a group selected from the group consisting of groups represented by a formula (a-1), a formula (a-2) and a formula (a-3)$_1$

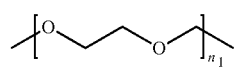
(a-1)

in the formula (a-1), $n_1$ is an integer of 1 to 8,

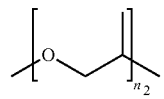
(a-2)

in the formula (a-2), $n_2$ is an integer of 1 to 8,

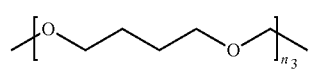
(a-3)

in the formula (a-3), $n_3$ is an integer of 1 to 8,
$A_2$ is a divalent organic group having an aromatic structure, an alicyclic structure, or both,
B is a glycidyl group,
n is an integer of 1 or more.

11. The method for preparing a flexible encapsulating material of claim 10, wherein based on 100 parts by weight of the usage amount of the epoxy resin (A), a usage amount of the curing agent (B) is 5 to 12 parts by weight, a usage amount of the curing accelerator (C) is 0.01 to 0.1 part by weight, and a usage amount of the coupling agent (D) is 0.1 to 2 parts by weight.

* * * * *